(12) United States Patent
Hara et al.

(10) Patent No.: US 7,953,582 B2
(45) Date of Patent: May 31, 2011

(54) METHOD AND SYSTEM FOR LITHOGRAPHY SIMULATION AND MEASUREMENT OF CRITICAL DIMENSIONS

(75) Inventors: Daisuke Hara, Yokohama (JP); Takashi Mitsuhashi, Fujisawa (JP); Zhigang Wu, Yokohama (JP)

(73) Assignee: Cadence Design Systems, Inc., San Jose, CA (US)

( * ) Notice: Subject to any disclaimer, the term of this patent is extended or adjusted under 35 U.S.C. 154(b) by 740 days.

(21) Appl. No.: 11/603,526

(22) Filed: Nov. 21, 2006

(65) Prior Publication Data

US 2008/0120073 A1    May 22, 2008

(51) Int. Cl.
*G06G 7/48* (2006.01)
(52) U.S. Cl. .......................................... 703/6
(58) Field of Classification Search ........................ 703/6
See application file for complete search history.

(56) References Cited

U.S. PATENT DOCUMENTS

| | | | |
|---|---|---|---|
| 4,442,188 A * | 4/1984 | Chiang | 430/5 |
| 5,424,173 A | 6/1995 | Wakabayashi et al. | |
| 5,952,135 A | 9/1999 | Ghandehari et al. | |
| 6,175,417 B1 | 1/2001 | Do et al. | |
| 6,701,474 B2 | 3/2004 | Cooke et al. | |
| 6,760,640 B2 * | 7/2004 | Suttile et al. | 700/121 |
| 7,013,439 B2 | 3/2006 | Robles et al. | |
| 7,018,746 B2 | 3/2006 | Cui et al. | |
| 2002/0100004 A1 | 7/2002 | Pierrat et al. | |
| 2004/0228515 A1 | 11/2004 | Okabe et al. | |

OTHER PUBLICATIONS

Depesa et al., Automated critical dimension and registration communication; Proc. SPIE vol. 1604, (one page— abstract), 11th Annual BACUS Symposium on Photomask Technology, Kevin C. McGinnis; Ed., 1992.*
Peters, Laura, "DFM: Worlds Collide Then Cooperate," Semiconductor International, Jun. 2005, Retrieve from the Internet. <URL: http://ww.synopsys.com/products/tcar/pds/semi_int_june05.pdf>.
Inanami, et al. "Throughput Enhancement Strategy of Maskless Electron Beam Direct Writing for Logic Device", Process & Manufacturing Engineering Center, Semiconductor Company, Toshiba Corp. pp. 833-836.
Hara, et al. "Character Projection EB Data Conversion System Combined with Throughput Analyzer", Jpn J. Appl. Phys. vol. 33, Oct. 1994, pp. 6935-6939.
Hattori, et al. "Electron-beam direct writing system EX-8D employing character projection exposure method", J. Vac. Sci. Technol. B 11(6) Nov./Dec. 1993, pp. 2346-2351.
Nakasugi, et al. "Maskless lithography using low-energy electron beam: Recent results for proof-of-concept system", J. Vac. Sci. Technol. B 20(6), Nov./Dec. 2002, pp. 2651-2656.
International Search Report and Written Opinion dated Aug. 11, 2008 for PCT/US2007/85090.
Lapanik et al.U.S. Appl. No. 11/607,753, filed Nov. 11, 2006.
Fujimura, A. et al. U.S. Appl. No. 11/603,603, filed Nov. 21, 2008.

(Continued)

*Primary Examiner* — Hugh Jones
(74) *Attorney, Agent, or Firm* — Vista IP Law Group, LLP

(57) ABSTRACT

A method and system for lithography simulation is disclosed. The method and system specify a subject region of a lithography image with a CD marker, specify a threshold intensity over the lithography image, specify a gradient to a threshold value of the threshold intensity, and calculate a sensitivity or ratio of change of an image boundary of the lithography image to lithography process variation.

24 Claims, 11 Drawing Sheets

OTHER PUBLICATIONS

Yoshida, K., U.S. Appl. No. 11/603,441, filed Nov. 21, 2006.
Yoshida et al. U.S. Appl. No. 11/607,305, filed Dec. 1, 2006.
Fujimura et al. U.S. Appl. No. 11/677,973, filed Feb. 2, 2007.
Hara et al. U.S. Appl. No. 11/603,527, filed Nov. 11, 2006.
Mitsuhashi,T. U.S. Appl. No. 11/678,530, filed Feb. 2, 2007.
Mitsuhashi,T. U.S. Appl. No. 11/226,253, filed Sep. 15, 2005.
Non-Final Office Action mailed Oct. 15, 2009 for U.S. Appl. No. 11/678,530.
Final Office Action dated Apr. 5, 2010 for U.S. Appl. No. 11/678,530.
Sengupta, C. et al. "Automated evaluation of critical features in VLSI layouts based on photolithographic simulations," IEEE Trans. Semiconduct. Manufact., vol. 10, pp. 482-494, Nov. 1997.
Non-Final Office Action dated Oct. 4, 2010 for U.S. Appl. No. 11/678,530.
Final Office Action dated Mar. 14, 2011 for U.S. Appl. No. 11/678,530.

\* cited by examiner

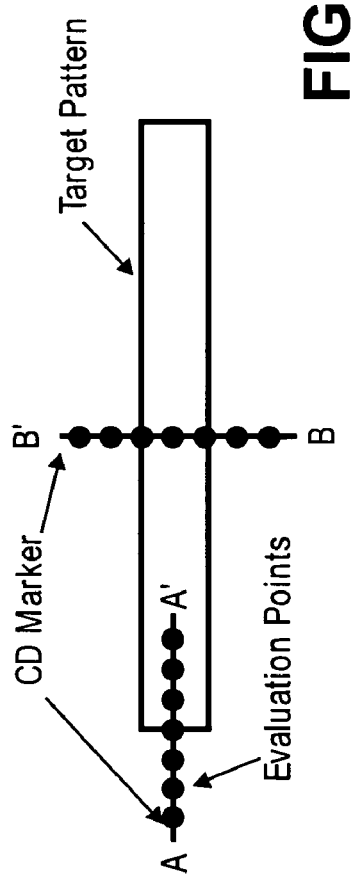
FIG. 4
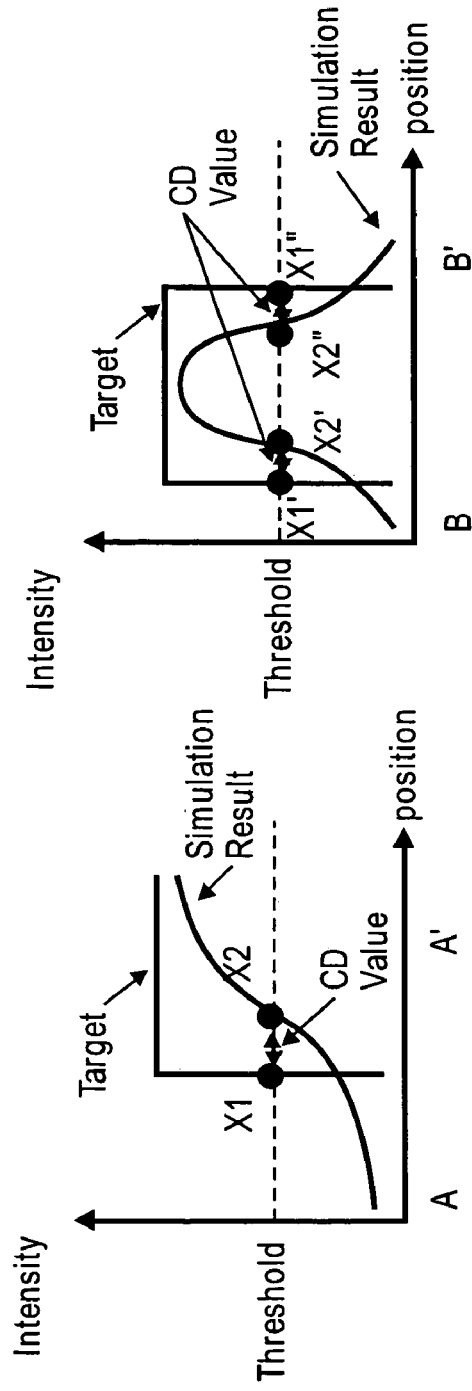
FIG. 5A
FIG. 5B

Library Data

Design Data

METHOD AND SYSTEM FOR LITHOGRAPHY SIMULATION AND MEASUREMENT OF CRITICAL DIMENSIONS

BACKGROUND

1. Field

The field of the present invention relates to lithograph technology for fine image fabrication, and in particular to a lithography simulation system and measurement of critical dimensions.

2. Description of Related Art

Fine image fabrication by lithography uses technologies like particle beam writers for writing fine images on a plate coated by a particle beam sensitive resist and an optical projection lithography method that uses a mask having transparent and opaque parts on the surface of the mask for generating a fine image on a plate coated by a photo sensitive resist. An example of particle beam writers is an electron beam writer that is used for writing fine images on both silicon wafers and masks for optical projection lithography. A technology that uses electron beam writers for making fine images for semiconductor integrated circuits directly on the semiconductor wafer is called Electron Beam Direct Writing (EBDW) technology. EBDW technology is suitable for integrated circuit fabrication that requires a quick turn around time.

A fundamental problem with conventional lithograph technologies is image quality degradation and resolution limits caused by chemical and physical effects in the process of the technologies. An example of such phenomena is proximity effect, which occurs in both electron beam writing and optical projection lithography and causes differences between intended patterns and images obtained by the lithography technologies. This degradation of the image quality becomes serious when the image is finer. An accurate measurement of the image quality degradation or measuring differences between intended patterns and images distorted by the proximity effects are important for accurate correction of the effects.

Measurement of critical dimension (CD) of the image at a predefined point is important and called CD measurements. With reference to semiconductor integrated circuits, as an example, CD measurement is conventionally done by Critical Dimension Scanning Electron Microscope (CD-SEM) after fabricating the image by the lithography. The CD measurement results are required before fabrication of the image.

To resolve the above mentioned issues related to conventional CD measurement, simulators for analyzing proximity effect have been developed. Using these type of simulators, the degree of image quality degradation or differences between intended patterns and images obtained by the lithography technologies becomes predictable without fabrication. This simulation method still has a problem, wherein these simulators consume huge amounts of computing time for obtaining the lithography image for large area similar to a whole LSI chip. Specifying the CD measurement points is also tedious and time consuming work when the objective area becomes large. Even if CD measurement results are obtained, the amount of data is huge, and it is difficult to understand the result intuitively.

Another issue related to the lithography technology for fine image fabrication is that the obtained image becomes sensitive to the lithography process parameters with progress of image miniaturization. The sensitiveness is referred to as lithography process sensitivity hereafter. The lithography process sensitivity depends on a position of the image and environment of the image. Although knowing lithography process sensitivity at specified points of the image contributes to lithograph technology, no quick method is reported to calculate the lithography process sensitivity.

The conventional CD measurement equipment usage method, such as CD-SEM, as an example, is not efficient. The measurement points are conventionally specified by human engineers, wherein the selected points might not be optimal in the sense of efficient use of measurement equipment. Selecting many measurement points is also difficult for engineers.

In light of the foregoing discussion, a method and system that improves the speed of lithograph simulation and simultaneously improves the efficiency and accuracy of the CD measurement of the image by lithograph technologies is needed. The system should be capable of displaying huge amounts of data obtained by the CD measurement effectively and intuitively. In one aspect, sharing of CD measurement related data between the simulation and the equipment is required for the system to improve efficiency and accuracy of the CD measurement. Although the conventional CD measurement methods focus on visible dimensions of the image, finding potential risk points of the image is essential with reference to the high lithography process sensitivity region. The CD measurement method that uses the lithography simulation should support such requirements.

SUMMARY

In the semiconductor manufacturing industry, lithography technology enables printing of accurate and fine patterns on wafers or masks. Electron Beam Direct Writing (EBDW) method allows writing patterns on a wafer by electron beam, and optical lithography (OL) methods enable printing images by predefined masks. Differences between intended patterns and an obtained printed image are observed in both EBDW and OL cases, which are caused by chemical or physical processes like proximity effect.

Computer simulation is an efficient means to investigate differences between intended patterns and obtained images. CD (Critical Dimension) measurements that measure critical dimensions of the image based on the computer simulation results are important and helpful. CD measurement results in conjunction with quality control of semiconductor manufacturing process can contribute yield improvement and efficient quality control.

To achieve the above mentioned objectives, the concepts listed below contribute to improvement of quality and accuracy of lithography technology: (1) a method and equipment for fast lithography simulation and CD measurement, (2) an effective method for specifying measurement points that are critical and to be checked with attention, (3) a display method and equipment that is intuitively understandable, (4) a data processing system and method that transfer information based on CD measurement results by simulation for controlling, guiding inspection point finding, and helping inspection equipments, and (5) a method and system for calculating sensitivity of process variation to lithography image.

A calculation method enables calculation of simulation based CD measurement results with small computing time by using CD markers for reducing computational efforts is presented.

A CD marker setting method uses design hierarchies for reducing tedious manual CD marker setting operations. The design hierarchy includes library cells and blocks that are repeatedly used in the design.

A lithography process sensitivity concept enables indication of potentially critical parts of lithography images and a fast calculation method of the lithography process sensitivity. The method uses CD marker for limiting calculation area for reducing computational time.

A CD measurement result display method and equipment for helping intuitive understanding of distribution of CD measurement results is disclosed. The resultant values are associated with geometrical display of the lithography images.

An intuitive and efficient method specifies a region for calculating partial statistical quantities. The method allows specifying the region from a display device showing images related to the layout.

A method improves efficiency and accuracy of dimensional inspections and measurement of products like wafers and masks. The method forwards information generated from CD measurement simulation results and CD Markers to the equipment.

These and other objects and advantages of the present teachings will become more fully apparent from the following description taken in conjunction with the accompanying drawings.

BRIEF DESCRIPTION OF DRAWINGS

FIG. 4 shows CD Marker and Evaluation points.

FIGS. 5A-5B show embodiments of a CD Measurement method.

DETAILED DESCRIPTION

Figure 1:
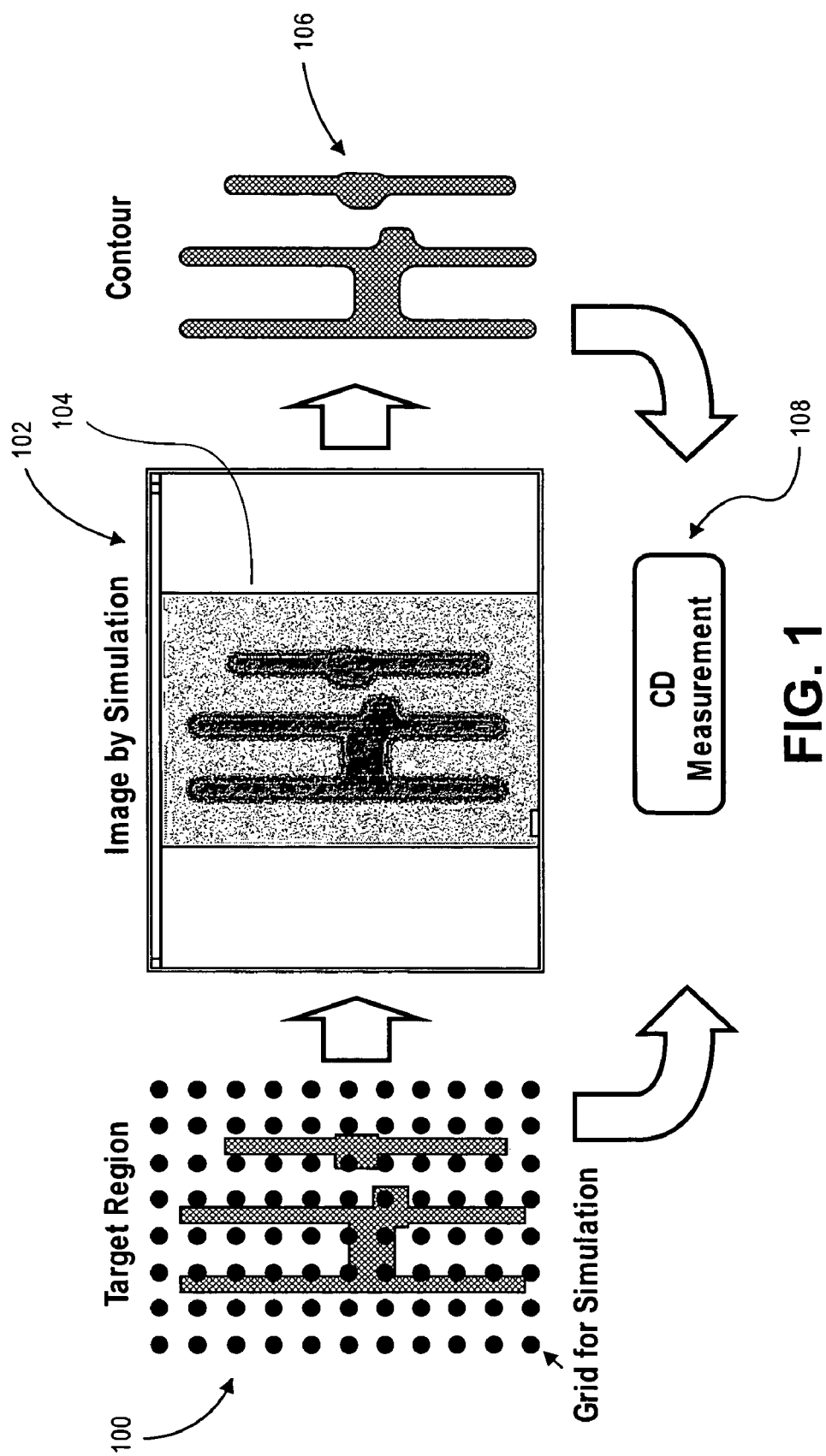
FIG. 1 shows conventional lithography simulation and procedure of CD measurement by the simulation.

Various embodiments of the present invention are described hereinafter with reference to the drawings. It should be noted that the drawings are not drawn to scale and that elements of similar structures or functions are represented by like reference numerals throughout the drawings.

FIG. 1 shows conventional lithography simulation and procedure of CD measurement by the simulation. A target region 100 is an area where lithography simulation is performed. A grid 102 for simulation is a set of points that covers the target region 100 and intensity of the lithography is calculated at the points. An image 104 of the lithography obtained by the simulation, and contour 106 of the intensity.

Lithography is an indispensable technology for modern fine manufacturing. In the semiconductor industry, for example, it is relatively difficult to build a semiconductor manufacture process without lithography technologies. Other examples include fabrication of MEMS (Micro Electro-Mechanical System) and other micro-fabrications.

Although lithography is a strong technology for micro fabrication, it is not perfect. One of the issues is the proximity effect that degrades images obtained by the technology. The proximity effect is caused by influences of images placed near by, and changes the shape of the images. The proximity effect is caused by chemical and physical lithography process and occurs in both optical lithography and a lithography that uses a charged particle beam like an electron beam. More precisely speaking, the effect is caused by scattering of particles like electrons and photons that penetrate into resist and collide with molecules in resist and underlying materials.

To know the proximity effect by simulation is important for understanding how the degrading of the image occurs and for knowing the most effective way of the proximity effect correction. Hereafter, this simulation is called lithography simulation.

Conventionally several proximity or lithography simulators have been developed. However, it is not reported that those simulators can provide good quality images for sufficient area in a semiconductor application, such as, for example, a full chip region. Several studies on lithography simulation have been reported for accomplishing high speed calculation. These examples of devices include an acceleration of convolution calculation that is required in lithography simulation by FFT (Fast Fourier Transform), reduction of computational amount by using irregular evaluation point mesh that is dense for steep intensity changing region and is coarse for gradually intensity changing region, and so on. However, those devices are not satisfactory for users who need lithography image for a large domain.

In one aspect, the purpose of obtaining the image by a lithography simulator is considered. FIG. 1 shows an example of practical use of conventional lithography simulation results. Intensity of the lithography that is a quantity required to know, deposit energy for an example, is calculated for each point of a grid that covers a target region 100. The calculated results of the intensity can be seen as shown by "Image by Simulation" 104 in FIG. 1. Moreover, it is required to know how the latent image is developed and seen on the resist. For such cases, a contour tracking program can be used to draw contours 106 that show development threshold of the resist. Measuring quantitative difference between image by lithography and the intended pattern at critical point of the pattern is important for understanding accuracy of the lithography. This is called CD (Critical Dimension) Measurement 108 and is commonly used for quality control of the wafer and mask fabrication. From quality control point of view, CD measurement 108 is more important than viewing images by the lithography.

Figure 2A:
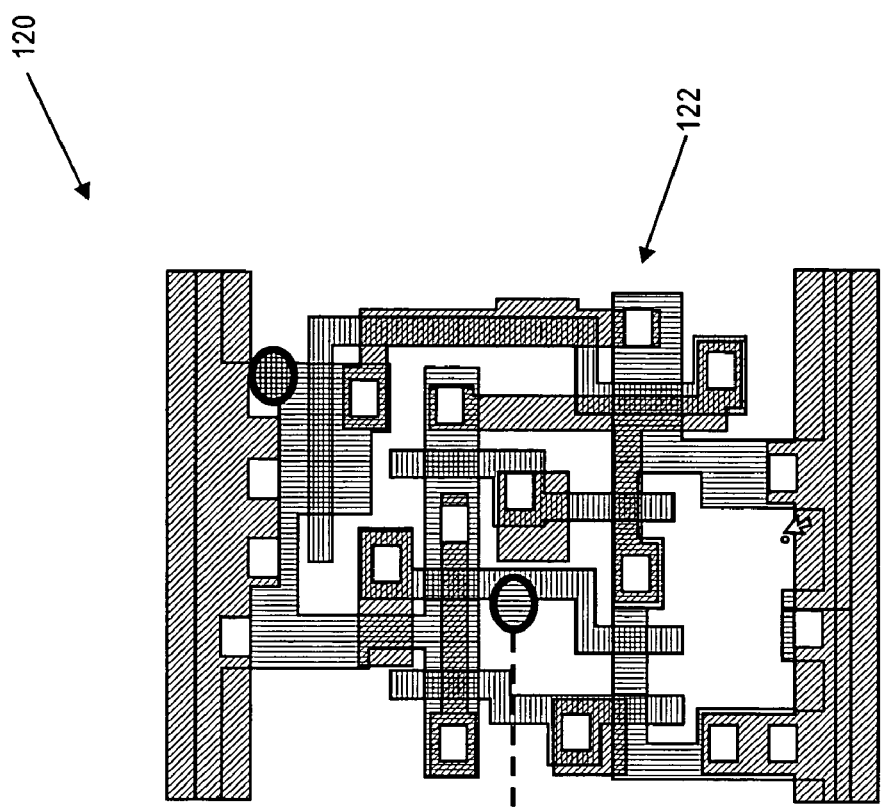
FIG. 2A shows one embodiment of CD Measurement and IC Layout.

Detail of the CD measurement 108 will be described with reference to semiconductor integrated circuits, as an example. FIG. 2A shows one embodiment of CD measurement 120 with an example of a logic cell layout 122, such as an integrated circuit (IC) layout, and FIG. 2B shows a part 124 of the logic cell layout with P1~P5 indicating CD markers.

FIG. 2A depicts an example of a layout for semiconductor integrated circuits (ICs) and a concept of CD measurement. FIG. 2B shows a part of the integrated circuit (IC) layout 122 and a pattern 124 for poly-silicon layer that is, for example, a gate of an MOS transistor. P1 through P5 of FIG. 2B show examples of CD measurement categories. In one embodiment, the meaning of each symbol is; for example, P1—gate length, P2—end cap or gate fringe, P3—gate position, P4—inner corner, P5—outer corner, respectively.

In the lithography process by the particle beam writing, many physical and chemical effects give influence on images obtained on the resist. Such effect or variation includes temperature, chemical component of resist, stability of e-beam gun, and other environmental conditions. In one aspect, these variational effects are called lithography process variation hereafter. By these variations, the image obtained by the lithography changes to some extent. It is required to estimate the influence of such variation to the image. The influence of the process variation to the image varies depending on a position of the image. It is difficult to evaluate each effect of the lithography process variation, but representing variation of those effects by change of threshold of lithography intensity is a reasonable way. Lithography process sensitivity is defined as influence of the threshold change to the change of the lithography image.

Figure 2B:
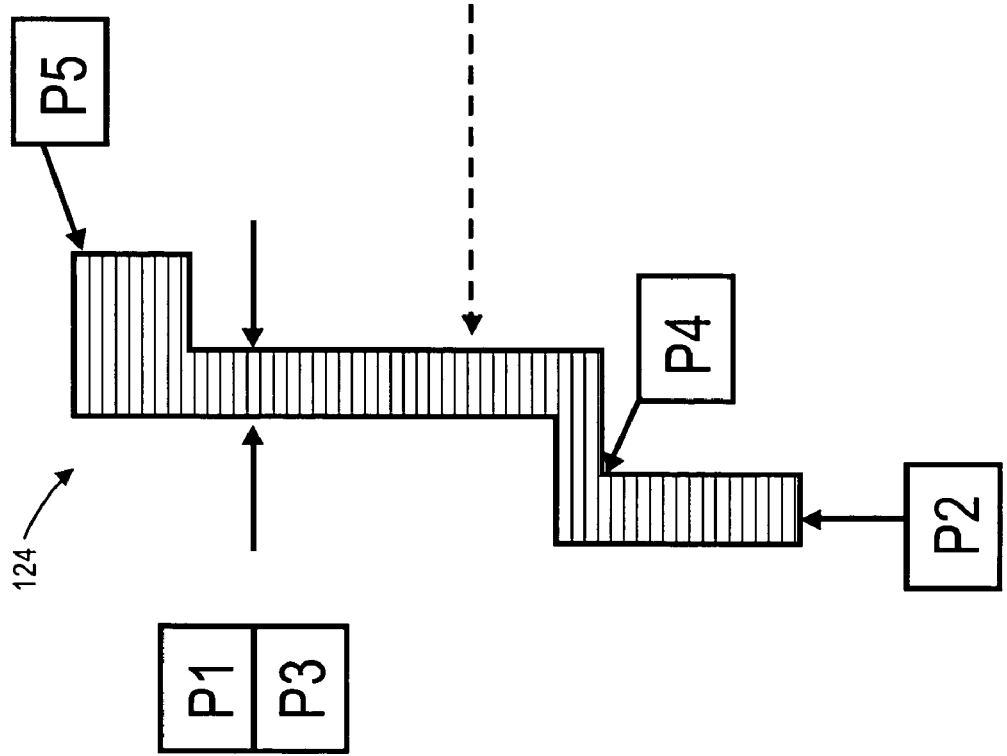
FIG. 2B shows a part of the IC Layout of FIG. 2A.
Figure 3:
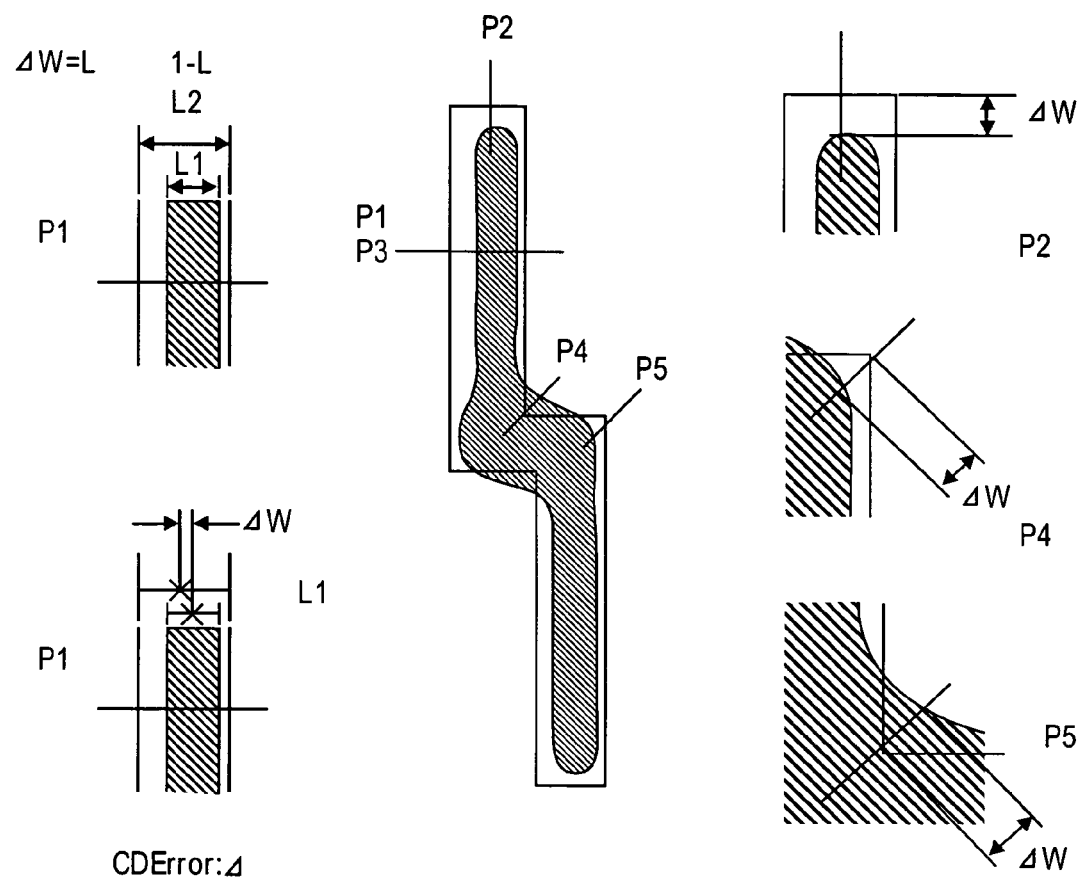
FIG. 3 shows CD measurement categories P1~P5.

FIG. 3 explains CD measurement categories with reference to CD measurement categories P1~P5 of FIG. 2B.

P1~P5 indicate categories for the CD markers. P1, for example, is a category that measures line width. P2, for example, is a category that measures shortening of line end. P3, for example, is a category that measures absolute distance between obtained image and target patterns. P4, for example, is a category that measures rounding at a convex vertex. P5, for example, is a category that measures rounding at a concave vertex.

In one aspect, categories P1~P5 intend to measure differences between obtained images and intended patterns. In a case of lithography simulation, evaluation of quantitative differences between images obtained by the simulation and intended pattern is important for quality control of the lithography.

In one aspect, CD measurement results in a number for quantitative quality control of the image obtained by lithography. Visible representation of a simulation result image, as shown in FIG. 1, for example, is helpful for intuitive understanding of the result but is not necessarily from qualitative quality control point of view.

FIG. 4 shows CD marker and evaluation points, and FIG. 4 explains detail of the CD marker, target pattern and evaluation points. In one embodiment, the target pattern is required by the design, and the CD marker is a geometrical entity that is a critical region required to be measured. In FIG. 4, AA' and BB' are examples of a CD marker, and the evaluation points are a set of coordinates where the lithography intensity is calculated. As shown in FIG. 4, CD markers are assigned to target patterns for indicating measurement points. In one aspect, AA' and BB' are examples of CD markers that are represented by line segments, for example.

In one embodiment, AA' is an example of CD marker usage that is applicable to the categories characterized by measuring distance between edges of the target pattern and image. P2, P4, and P5 of FIG. 3 are examples of this type. BB' is an example of CD marker usage that is characterized by measuring a difference between width of the image and the intended pattern. P1 is an example of this type of CD Marker. P3 in FIG. 3 is an example that measures difference of position between intended patterns and obtained images.

In one aspect, FIGS. 5A-5B show embodiments of a CD measurement method, and a principle of CD measurement by this invention is illustrated. Curves called Simulation Result indicate intensity of the lithography (deposition energy in e-beam case) on line segments AA' and BB'. Line graphs called Target are ideal intensity distribution for the target patterns. Horizontal lines called Threshold indicate level of lithography intensity that generates the lithography images.

FIGS. 5A-5B depict details of how CD values are measured by the embodiments in which CD markers are set, as shown in FIG. 4. Positional coordinates of placed CD markers are indicated on a horizontal axis. AA' of FIG. 5A corresponds to AA' in FIG. 4. Similar to the above example, BB' of FIG. 5B corresponds to BB' in FIG. 4. Vertical axis indicates an intensity of deposited energy of particles like electrons or photons that causes chemical reaction in the resist.

Intensity curves are calculated by simulation along with lines AA' and BB' and indicated by "Simulation Result" in FIGS. 5A and 5B. On the other hand, preferable intensity curves for getting the best images are step functions as shown by "Target" in FIGS. 5A-5B. Resist is modeled on a simple "Threshold" that determines where image appears. In FIGS. 5A-5B, image is developed in the area where intensity exceeds the "Threshold". This is a simple model but behavior of the resist is described. "CD Value" that is defined by the difference between target pattern and image by lithography is measured as a distance between a cross point of "Target" line and "Threshold" line and a cross point of "Simulation Results" and "Target" line. In FIG. 5A, CD value is distance between X1 and X2, and in FIG. 5B, CD value is calculated based on distances between X1'/X1" and X2'/X2".

In one aspect, the above description of CD measurement method indicates there is no need to calculate intensity of all grid points in the target region for calculating CD values. Calculation of intensity on the region related to a CD marker is sufficient. By this invention, the number of the intensity calculation is drastically reduced. In one embodiment, this method can obtain the same CD measurement results within approximately ¼₀~⅟₉₀ of CPU time required for the conventional method that is described in FIG. 1. In one embodiment, the herein described method of the invention enables evaluation of specified critical dimensions of lithography image for large regions like a whole chip that was impossible by the conventional method.

Figure 6:
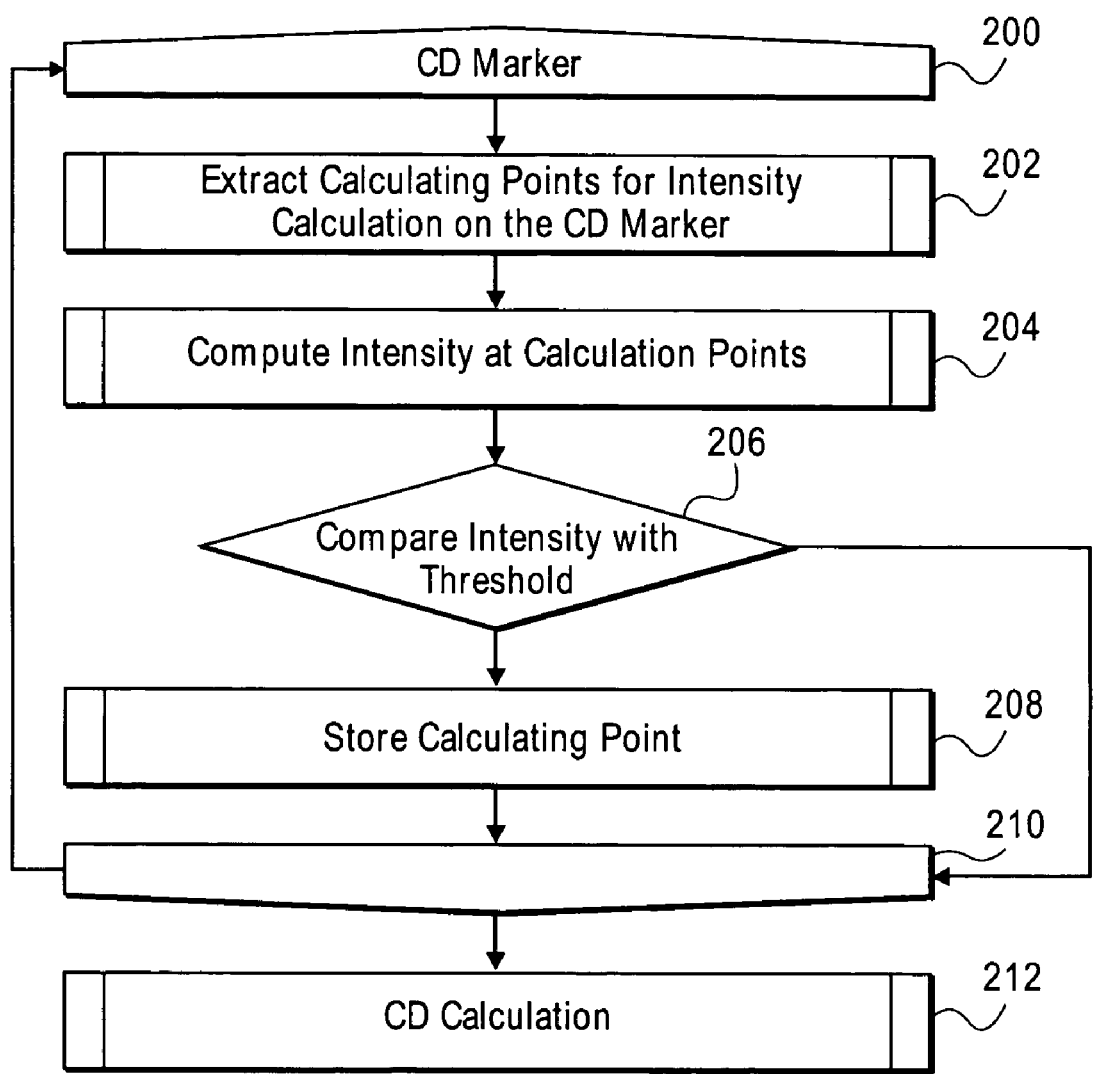
FIG. 6 shows one embodiment of a flowchart for CD Measurement.

The following description is an example of the embodiment of the CD measurement system. It should be appreciated that there are many other embodiments based on the invention. In one aspect, FIG. 6 shows one embodiment of a flowchart for CD measurement. An example of CD measurement procedure is explained step by step in FIG. 6, wherein FIG. 6 depicts one embodiment of a flowchart of the invention.

In one aspect, step (200) and (210) of FIG. 6 respectively indicate a start point and end point of a repetition. It should be appreciated that steps between (200) and (210) can be repeated for all CD markers in an objective region.

In step (202), the intensity evaluation point(s) on the CD marker line segment is (are) determined.

In step (204), intensity of lithography on the point(s) determined in step (202) is (are) calculated.

In step (206), a threshold of the intensity and the intensity calculated in step (204) is compared.

In step (208), a point at which the intensity is equal to the threshold is stored in memory. In one aspect, storing formats of the point data for this step depend on the category of the CD measurement. An quality check can be accomplished by step (206). If the equality check is not satisfied, step (208) will be skipped.

In step (212), CD values are calculated based on both the point information stored at step (208) and the category specified by the CD markers. In one aspect, examples of the category are depicted as P1~P5 of FIG. 3.

In one embodiment, lithography process sensitivity is a type of CD value. Different from category P1~P5 that are calculated based on intensity-threshold equivalent point information, the lithography process sensitivity is calculated based on an idea related to differential calculus. In lithography technology, gradient of the intensity curve near the threshold value is important. The sensitivity that is defined as influence of process variation to the image by the lithography (hereafter called lithography process sensitivity) decreases when the intensity curve is steep. In other words, the shape obtained by the lithography changes largely when the intensity curve is gradual.

The CD measurement method by this invention is applicable for the above mentioned lithography process sensitivity check. A questionable area from lithography process sensitivity point of view is a region where ΔI/distance (P1,P2) is less than a specified value, P1 is a point where intensity of the lithography is equal to the threshold, and P2 is a point where intensity of the lithography is equal to the threshold+ΔI, where ΔI is a specified small value compared with the threshold value. This type of CD measurement is conventionally not easy to perform because the point where the intensity is equal to threshold+ΔI is difficult to observe in the resist. In one aspect, the CD measurement method by this invention allows estimation of this type of value by virtue of simulation base method.

Figure 7A:
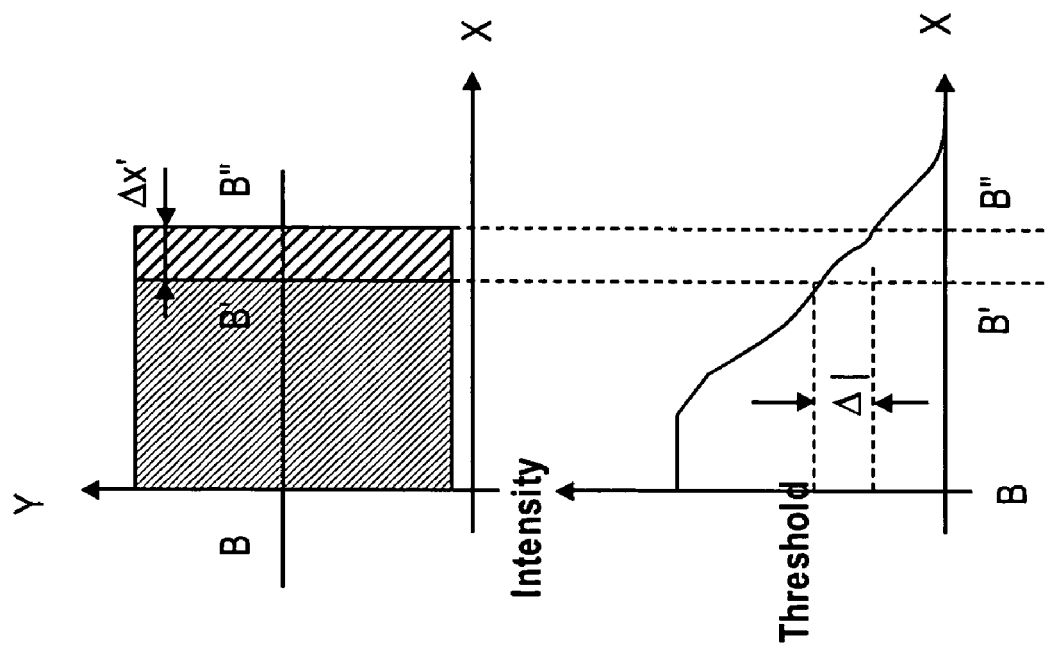
FIGS. 7A-7B shows sensitivity of an image to lithography variation.
Figure 7B:
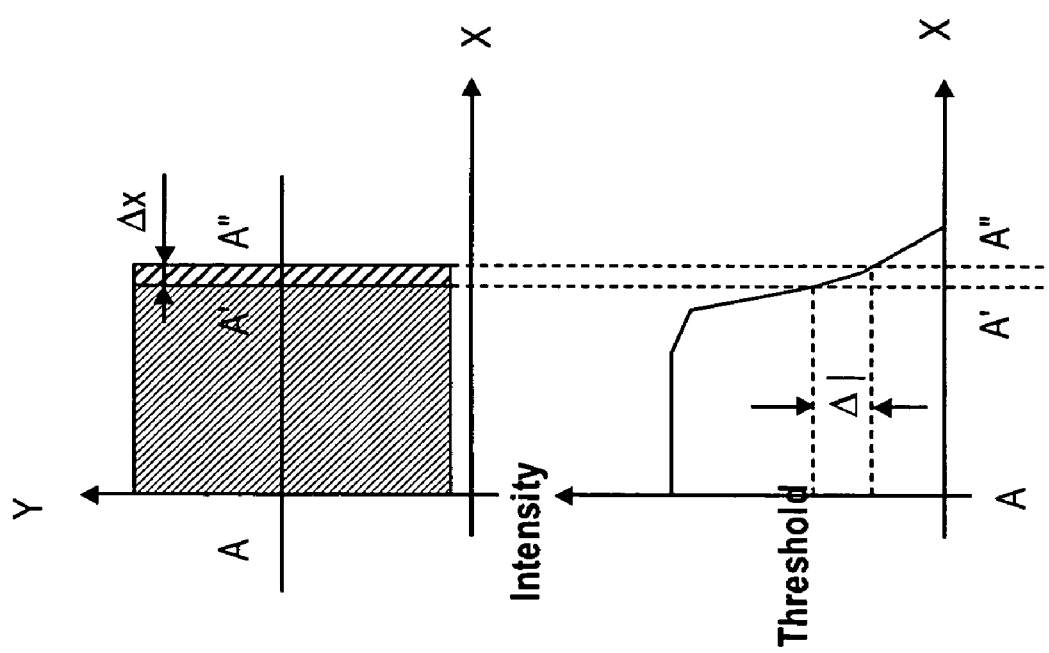

FIGS. 7A-7B show sensitivity of an image to lithography process variation. How process variations influences images obtained by lithography technologies is depicted in FIGS. 7A-7B. FIG. 7A shows, for example, a case where the intensity curve is steep at the cliff of the intensity. FIG. 7B shows a case where the intensity curve is gradual. In one embodiment, lower charts of FIGS. 7A and 7B show intensity curves on line AA' and BB', threshold levels, and threshold+ΔI level, and upper charts of FIGS. 7A and 7B show how the images that are developed in both case.

FIGS. 7A-7B depict how process variations influences images obtained by lithography technologies. In case of FIG. 7A, intensity curve is steep so that influence of the process variations on the images is relatively small. In case of FIG. 7B, gradient of intensity curve is gradual compared with case 7A, so that the image changes caused by lithography process changes (one example is variation of resist temperature) are larger than case 7A.

In FIGS. 7A and 7B, X-Y coordinates of upper chart of FIGS. 7A and 7B indicate geometrical positions on a plane coated by resist, and rectangles indicate the images obtained by lithography technologies. On the other hand, X-Y coordinates in lower part of FIGS. 7A and 7B indicate intensity of the lithography and geometrical positions on line AA" and BB". Image appears where intensity of energy, for example, exceeds predefined threshold. In one aspect, the threshold of the intensity varies depending on states of resist and other process parameters like temperatures. FIGS. 7A and 7B explain a case in that the threshold intensity decreases ΔI by variation of some process parameters. In case the threshold intensity decreases, intersections of the intensity curve and the threshold will shift from A' to A" and B' to B". As a result of threshold shift, a boundary of the image moves to a point of Δx right, and the image becomes large. In case of FIG. 7B, the boundary of the image also moves to a point of Δx' right, and the image becomes large. As a conclusion of the discussion on FIGS. 7A and 7B, Δx<Δx' or the boundary move of (A) is smaller than that of FIG. 7B because the intensity curve for FIG. 7A is steeper than that for FIG. 7B.

Based on above mentioned invention and principle, a system can be implemented that reports a subset of regions specified by CD markers that have potential risk of generating poor images because of the high lithography process sensitivity. The region where a distance between P(T) and P(T+ΔI) is larger than a specified value related to the ΔI will be reported, where P(T) is a cross point of the intensity curve and threshold line, and P(T+ΔI) is a cross point of the intensity curve and threshold+ΔI line on a CD marker line. This check is useful for identifying regions where generated images are potentially unstable for process variation in other word lithography process sensitivity is high.

Figure 8:
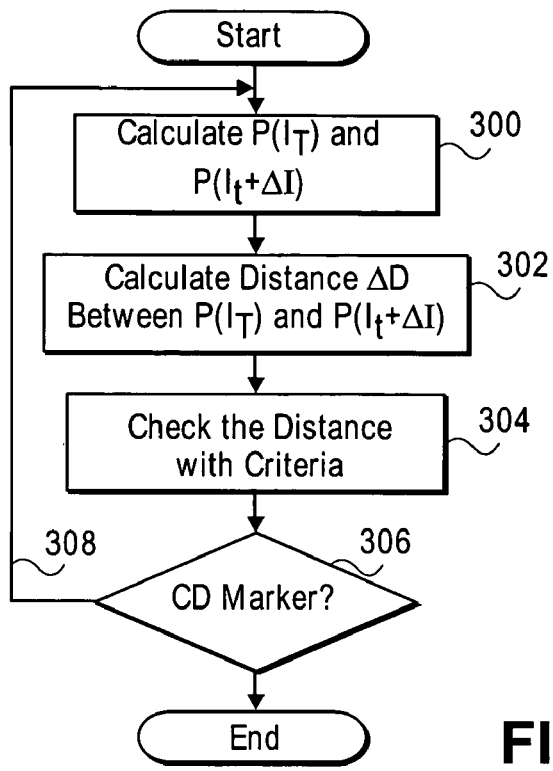
FIG. 8 shows a flow chart for high sensitivity point detection.

FIG. 8 shows a flow chart for high sensitivity point detection, and an example of lithography process sensitivity procedure is explained by a flow chart in FIG. 8. The sensitivity can be calculated as a part of CD measurement.

An embodiment of lithography process sensitivity calculation method based on the invention is described below. This is an example of the embodiment of the invention; other embodiments are also possible. The method and flow by the invention are described by FIG. 8.

Step 300: Calculation of point P ($I_T$) and P ($I_T$+ΔI) on a specified CD Marker is done, where P($I_T$) is a cross point of the intensity curve and threshold line $I_T$ and P ($I_T$+ΔI) is a cross point of the intensity curve and threshold+ΔI.

Step 302: Calculation of ΔD=distance between P ($I_T$) and P ($I_T$+ΔI) is performed, that is a distance between edges of the lithography images assuming $I_T$ and $I_T$+ΔI as threshold values.

Step 304: Check whether calculated the distance ΔD of the step 302 is bigger than provided criteria. ΔD/ΔI is an index that indicates deviation of the image by the threshold changes caused by the lithography process variation. Risk of the image deviation increases with increase of the sensitivity.

Step 306: This is a step that checks completion of processing whole CD Markers. Loop 308 is a loop for repeating the remaining processes for CD Markers.

The lithography process sensitivity calculation method, as shown in FIG. 8, is an example of the embodiment and other embodiments using step 300, step 302, and step 306 can be possible.

The CD measurement of images by lithography technology can be performed quickly by the above mentioned methods. Efficient assignment of CD Markers at appropriate points is another issue. A method by conventional thinking is using layout database flattened by software and placing the markers at critical points by hand. However, it is tedious and time consuming to place CD markers at all critical points on a chip.

To resolve above mentioned marker assignment problem, the following method and system are disclosed. By the disclosed method, templates of CD markers are associated with critical points of polygons in library cells in advance, and a CD marker is generated based on the template to a position where the cell is placed and instantiated. By the mentioned method, the CD marker marking becomes effective because preparing the templates for a library cell makes possible to repetitively generate CD markers where cells are placed. In one example, to embody the mentioned method, (1) embedding templates for CD markers in library cells and (2) generating CD markers at where the cells are placed, are required.

An embodiment of the disclosed method is control of CD marker generation by human operators' directions, which will be described in following section.

Figure 9A:
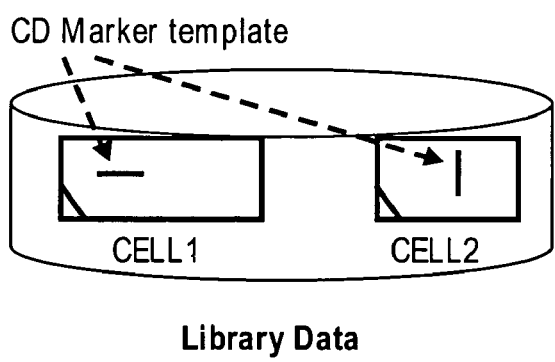
FIG. 9A shows CD Markers embedded in a cell library.
Figure 9B:
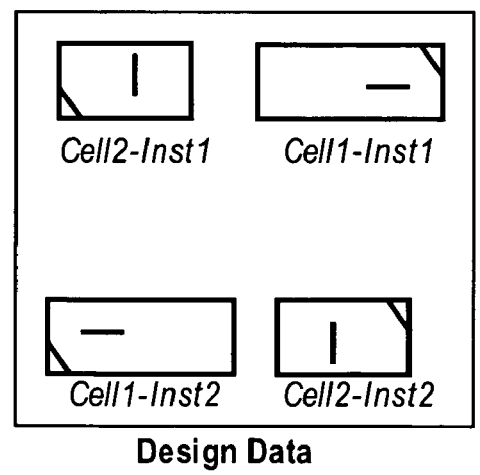
FIG. 9B depicts relations between CD marker template in library data.

FIG. 9A shows CD markers embedded in a cell library, and FIG. 9B depicts relations between CD marker template in library data, and how these templates are used in the design. FIG. 9A indicates a library where cells or blocks repetitively used are stored. FIG. 9B indicates a design that uses cells in the library. Cell 1 and Cell 2 are example names of the library cells. CD marker templates are associated with these library cells. In one aspect. both Cell 1 and Cell 2 are instantiated two times in design FIG. 9B.

In one aspect. FIG. 9A shows a library database in where cells, that may be used by a design, are stored. FIG. 9B shows an example of a design. In the example, both Cell A and Cell B are used twice for implementing the design. 4 times assignment of CD markers are required if no design hierarchy information is used, as shown in FIG. 9B. In case of using design hierarchy like cell library, same CD marker assignment is performed by preparing two CD marker templates. Effect and operation of the method is explained by an example. A cell in the library is sometimes referenced more than thousands times in a common design. In such case, reduction of time and effort for the CD marker assignment is large.

Figure 10:
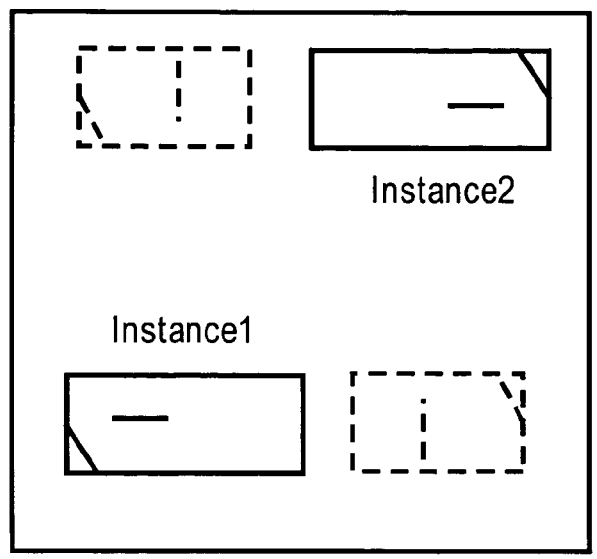
FIG. 10 shows a CD Marker selection by cell type.

FIG. 10 shows a CD marker selection by cell type. Generation of a CD marker is controlled by Cell name. FIG. 10 is an example that CD markers for cell 2 are not generated. FIG. 10 is an example that depicts merit of specifying template of the CD Marker by name of the cell type whether to generate CD Marker or not. Precise specification of cell instances for CD measurement can be doable by identifying it by cell types. FIG. 10 corresponds to FIG. 9B. Two instances of Cell 2 type in FIG. 10 are omitted from the evaluation objectives. The elimination operation can be easily performed by specifying cell types but not specifying cell instance one by one. Furthermore, using categories appeared in FIGS. 3 and 4 with the invention depicted in FIG. 10 allows more complex specification of CD measurement objectives. By virtue of this efficient filtering capability, it is more efficient to focus on a spot of interest and reduce computation time by eliminating unnecessary evaluation points.

Figure 11:
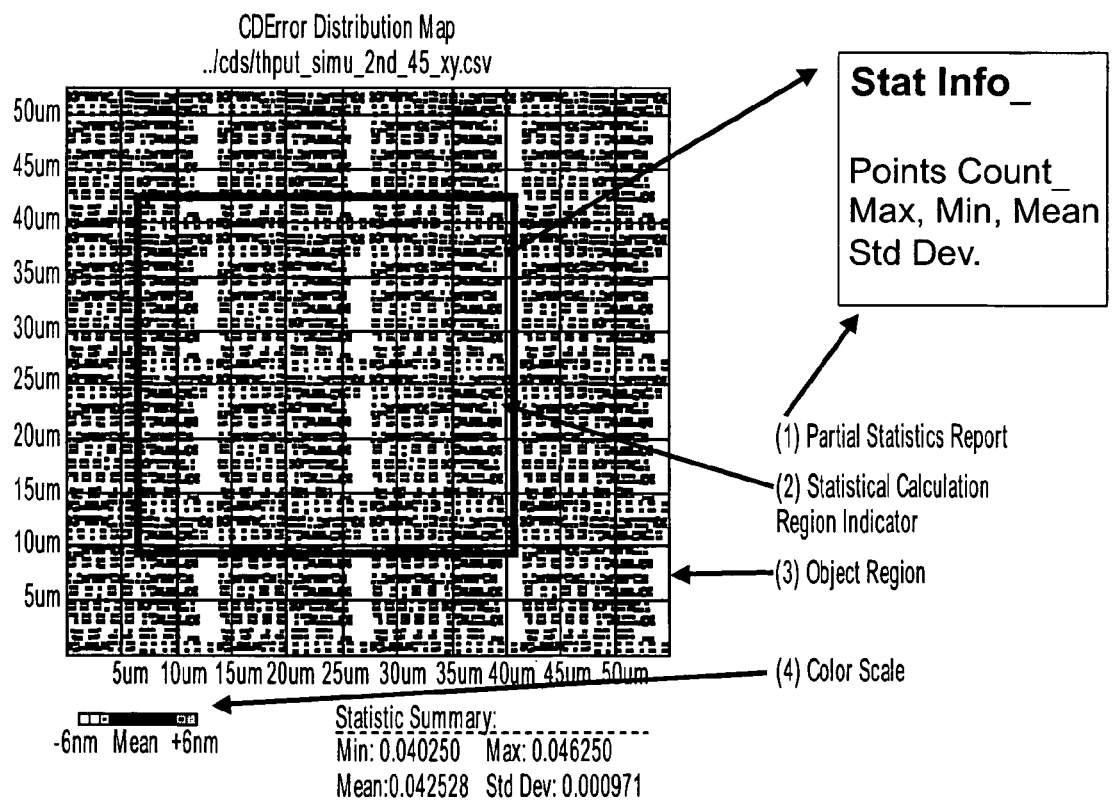
FIG. 11 shows an example of CD Measurement result display.

FIG. 11 shows an example of a CD measurement result display. Both layout and CD measurement results are displayed on a same screen. The value of the CD measurement results is indicated by color. (1) Partial statistics report shows statistic of a specified region. (2) Statistical Calculation Region indicator is used for specifying a region for the calculation. (3) Object Region is a region for the simulation. (4) Color Scale is used as a scale for the value of the CD measurement. CD measurement results are statistical quantities like average and standard deviation, and generally calculated for whole objective area. Partial statistical quantities of specified region are of interest for understanding result of dose correction.

FIG. 11 is an example of the display that are intended to fulfill one or more of the above mentioned requirements.

In one example, quantity of CD measurement results is displayed with a geometrical entity that is related to the CD marker. An example of the embodiment is using color for showing the quantity and polygon of the LSI layout for geometrical entity. FIG. 11 is an implementation that uses color and a rectangle related to the place of CD marker for display. By this display, a user of the system can intuitively understand CD measurement results.

In another example, partial statistical report generation capability is shown in FIG. 11. This capability allows the user to specify a region and to know partial statistical characteristics of the specified region. To satisfy such a requirement, the capability comprises a means for specifying one or more region(s) for statistical calculation, calculating statistical quantities of the specified region, and a means for displaying the calculation results. A system may comprise the above mentioned components.

FIG. 11 shows a statistical result display device as an embodiment. (1) Partial Statistic Report shows statistical calculation results for specified region. (2) Statistical Calculation Region Indicator shows a boundary of the region for statistical calculation. (3) Objective Region indicates whole area for the calculation. (4) Color Scale indicates quantitative result by CD measurement.

In one aspect, CD measurement result by lithography simulation is useful as a feedback to the engineers and is also helpful to improve design, proximity effect correction, dose correction, and RET (Resolution Enhancement Technology). Other uses of the CD measurement result assists inspection and measurement of real lithography images by CD SEM, for example.

Figure 12:
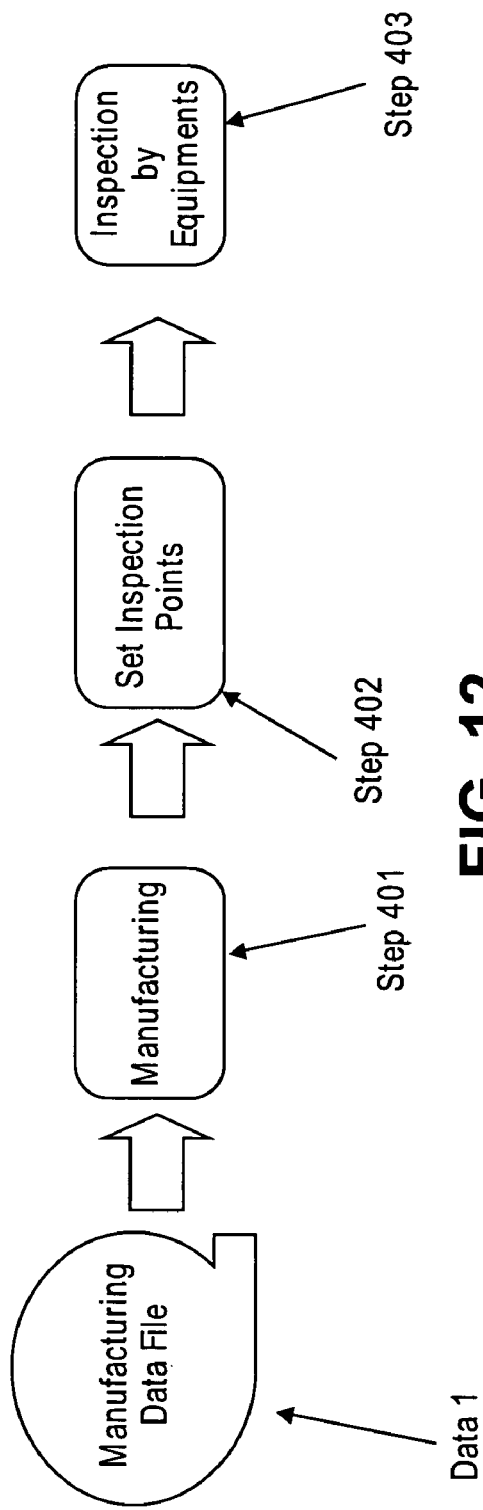
FIG. 12 shows a conventional interface to measurement equipment.

FIG. 12 shows a conventional interface to measurement equipment and shows a conventional process from the manufacturing data generation through the inspection. For example, data 1 shows manufacturing data generated by CAD equipment. Manufacturing is performed at Step 401. Inspection points for checking whether the product satisfies quality and spec are prepared and transferred to the inspection equipment at step 402. Inspections are done at step 403 according to the direction prepared at step 402. From the described procedure, the conventional method for inspection cannot use useful information that is generated with Data 1 preparation. To resolve this issue, a new method is introduced, as shown in FIG. 13.

Figure 13:
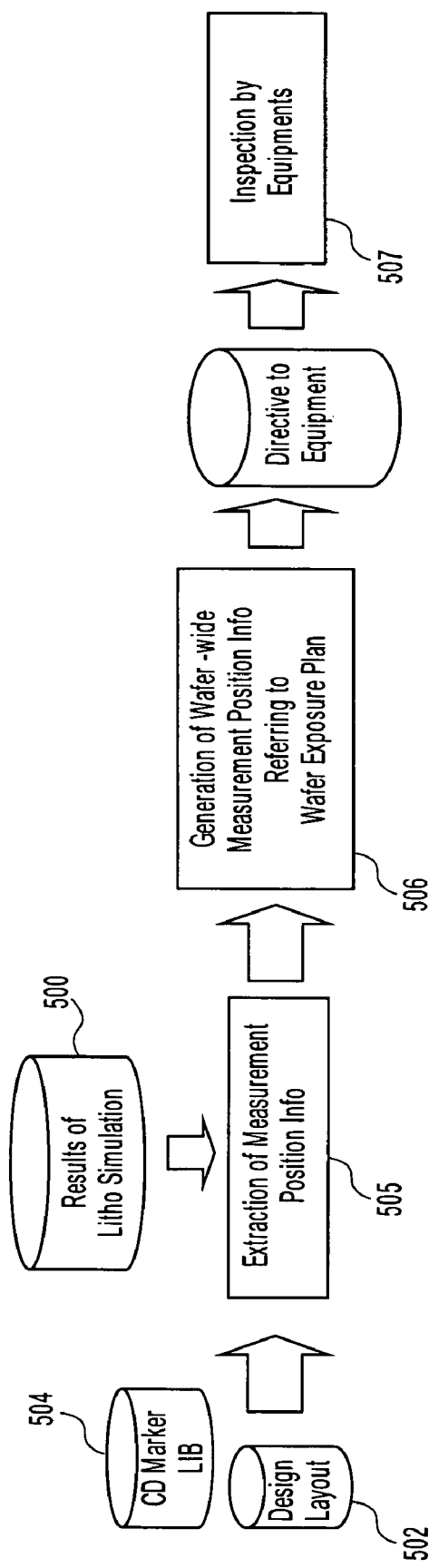
FIG. 13 shows one embodiment of an interface to measurement equipment.

FIG. 13 shows one embodiment of an interface to measurement equipment. Interface method of design information to inspection equipment by this invention is described. The design information includes lithography simulation results and CD marker information.

In the method depicted by FIG. 13, directive data for the inspection equipments is prepared using lithography simulation results 500, layout design data 502, and CD marker information 504. In one embodiment, the directive information including CD marker and geometrical shapes are provided to the inspection equipment, for example, CD SEM for automatic navigation of the equipment. Prioritizing CD markers can be based on the lithography simulation. The inspection or measurement is performed from highly prioritized CD markers to improve efficiency of the inspection. Effectiveness of the inspection can be improved by finding high lithography process sensitivity parts using the methods depicted by FIGS. 7A and 7B and transferring it to the equipment. The method is based on an idea of understanding which part of the design is less stable by using the simulator.

FIG. 13 shows an example of the interface method to measurement equipment by one aspect of the invention. The inputs of the methods are Design Layout (502), results of lithography simulation (500), and CD Marker library (504). The output of the method is a directive to the equipment. The directive information controls an inspection equipment in a effective manner. That means minimize or at least reduce the measurement time required to measure the critical dimensions. In step 505, a set of measurement positions on a chip is determined using a set of information shown by 500, 502, and 504. In one aspect, Prioritization or selection of the points can be done from efficiency point of view, for example, at step 505. In step 506, a chip level coordinate information is transformed in a wafer level because measurement or inspection of the fabricated chip is done on a wafer.

Figure 14:
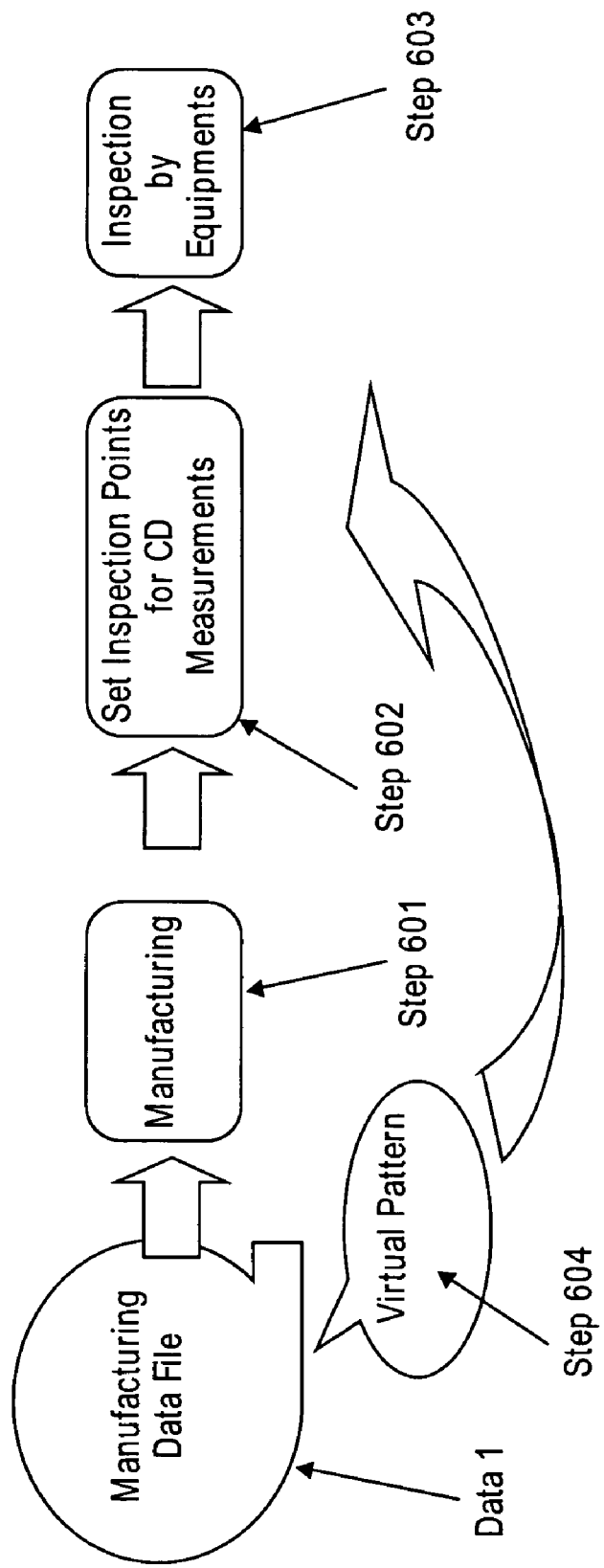
FIG. 14 shows one implementation example of transferring CD measurement information to inspection equipment.

FIG. 14 shows one implementation example of transferring CD measurement information to inspection equipment, and FIG. 14 depicts an embodiment by the invention. In one aspect, Data 1, Step 601, Step 602, and Step 603 are identical to that of FIG. 12. Step 4 is a step that creates virtual pattern by the lithography simulation and the CD markers.

In one embodiment, as shown in FIG. 14, a virtual pattern 604 is generated and helps the inspection. Data 1 is manufacturing data and a product is manufactured at step 601 using the data. In step 602, CD measurement information like inspection points is transferred to an inspection equipment at step 603.

Figure 15:
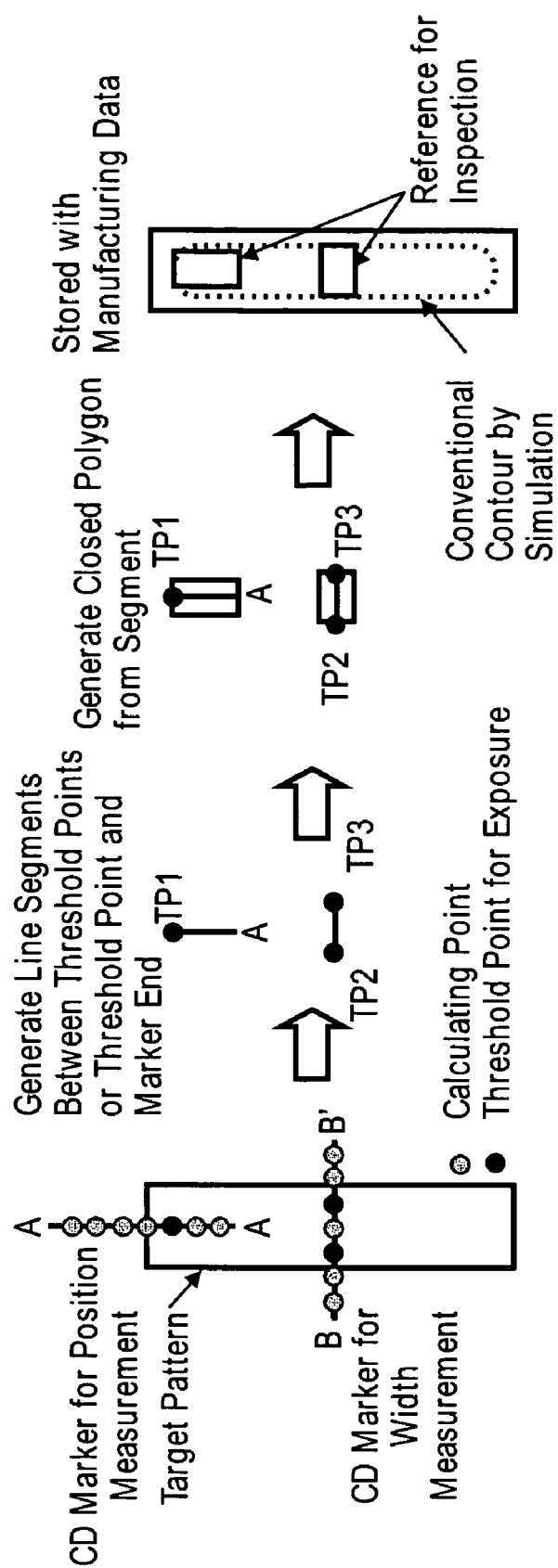
FIG. 15 shows an example of virtual pattern generation.

FIG. 15 shows an example of virtual pattern generation. A method for generating virtual pattern is described.

FIG. 15 depicts an example of generating virtual patterns for the inspection equipment. In one example. a virtual pattern may comprise a closed polygon generated based on line segments TP1-A' and TP2-TP3. TP1, TP2 and TP3 are points on CD marker lines and lithography intensity equal to the threshold. These virtual patterns are sent to the equipment and used for helping the inspection.

At the inspection equipment, the above described virtual patterns are useful for the following purposes. (1) A pointer helps visual check by operators and is also helpful for indicating a next checking object. (2) References for comparison are useful because the virtual patterns are generated based on lithography simulation, and they indicate a line edge of the lithography images.

In conventional lithography simulation, all grid points of an object domain are to be evaluated for getting intensity of the lithography. For E-beam case the intensity is deposition energy. Image generated by the lithography is conventionally obtained by a contour line tracking program that finds out equi-threshold intensity points for the image development and connects those points. The conventional method is time consuming. The method by this invention can significantly reduce computation time by focusing the computing domain using CD markers.

Assignment of the CD markers to regions of interest is required for above mentioned invention. In real mask fabrication and wafer production, the number of CD measurement points is limited because of required time for evaluation. In one aspect, the CD measurement by the invention has a merit that allows a huge number of measurements compared with the conventional real measurement. In general, it requires a preparation of huge CD markers that number is equal to the measurement points. In another aspect, the invention embeds a template for a CD marker into a library cell or block, which reduces time for CD marker assignment. This improves efficiency of the CD marker setting.

Lithography process sensitivity that indicates influence of lithography process variation to the obtained lithography image is a conventionally used idea. However, the conventional method requires evaluation of all grid points of an object domain. Different from conventional methods, the method by the invention can calculate the sensitivity effectively by using a method for CD Measurement. The calculation is effective and quick because it is done in the limited area specified by the CD marker.

In conventional CD measurement that is used for measurement of real masks and wafers, the measurement points are so small that few need of visual display of the result is said. However, the above mentioned technology invokes a need for intuitive understanding. in contrast, the displaying method by the invention enables visual understanding of relation between CD measurement results and layout image. For some users, it is useful to know partial statistical quantities like average and standard deviations. The method by the invention uses layout image display and means for specifying a region for the partial statistical calculation, which allows users a convenient means of giving directions. Conventionally, there is no such way of the specifying area for the calculation.

CD measurement is an important activity that is used for analyzing issues in a fabrication process and a judgment of whether a product is good or not. Unfortunately, in conventional system, decision of points for CD measurement is independently done in the manufacturing process. This invention enables providing the CD measurement activity with CD markers and related data from the design side. Moreover, the invention enables prioritizing and sorting CD Markers for effective CD measurement by using lithography simulation results in design domain.

In one embodiment, the methods disclosed herein by the invention are applicable for a simulation of mask and wafer writing by electron beam lithography, and are also applicable for the simulation of mask and wafer writing by more general charged particle beam writing.

In another embodiment, the methods disclosed herein by the invention are also applicable for the simulation of the mask and wafer writing by optical lithography.

In another embodiment, the methods disclosed herein by the invention are applicable to, but not limited to, mask and wafer writing but also for more general lithography technologies.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed is:

1. A computer-implemented method for lithography simulation comprising:
    associating a template with a critical point of a shape in a library cell stored in a library database;
    specifying a subject region of a lithography image with a CD marker, wherein the CD marker is generated based at least in part upon the template to a position where the library cell is placed and instantiated;
    specifying a threshold intensity over the lithography image;
    calculating an intensity of the lithography image within the subject region defined by the CD marker;
    specifying the subject region for statistical calculation;
    performing the statistical calculation for the subject region; and
    displaying the subject region and a statistical result of the calculation based at least in part upon the subject region together on a same screen of a display device.

2. The method of claim 1, wherein the CD marker includes at least geometrical information for defining the subject region.

3. The method of claim 1, wherein the CD marker includes category information that determines an evaluation method used for CD measurement.

4. The method of claim 1, wherein the subject region of the CD marker is defined by at least one line segment.

5. The method of claim 1, wherein a threshold value of the intensity for generating a image is specified and a sensitivity or ratio of change of an image boundary of the lithography image to lithography process variation is calculated.

6. A computer-implemented method for CD measurement calculation comprising:
- associating a template with a critical point of a shape in a library cell stored in a library database;
- calculating lithography intensity on a region or line segment determined by a CD marker, wherein the CD marker is generated based at least in part upon the template to a position where the library cell is placed and instantiated;
- determining a point when lithography intensity equals a threshold;
- calculating a value of CD measurement based at least in part upon information related to the determined point;
- specifying the region or line segment for statistical calculation;
- performing the statistical calculation for the region or line segment; and
- displaying the region or line segment and a statistical result of the calculation based at least in part upon the region or line segment together on a same screen of a display device.

7. The method of claim 6, wherein the point and the value are simultaneously displayed on the display device.

8. A lithography process sensitivity calculation system comprising:
- a processor programmed for:
- associating a template with a critical point of a shape in a library cell stored in a library database;
- specifying an objective region with a CD marker, wherein the CD marker is generated based at least in part upon the template to a position where the library cell is placed and instantiated;
- specifying a threshold intensity over a developed lithography image;
- calculating a sensitivity or ratio of change of an image boundary to lithography parameter variation;
- specifying the objective region for statistical calculation;
- performing the statistical calculation for the objective region; and
- displaying the objective region and a statistical result of the calculation based at least in part upon the objective region together on a same screen of a display device.

9. The system of claim 8, wherein the system evaluates the influence of lithography process variation to the lithography image obtained by lithography.

10. A lithography process sensitivity calculation method for evaluating lithography process variation to an image obtained by lithography, the method comprising:
- associating a template with a critical point of a shape in a library cell stored in a library database;
- specifying a region of a lithography image with a CD marker, wherein the CD marker is generated based at least in part upon the template to a position where the library cell is placed and instantiated;
- determining a first point when lithography intensity equals a threshold;
- determining a second point when lithography intensity equals the threshold plus a specified gradient value of the lithography intensity;
- calculating a distance between the first and second points;
- specifying the region for statistical calculation;
- performing the statistical calculation for the region; and
- displaying the region and a statistical result of the calculation based at least in part upon the region together on a same screen of a display device.

11. The method of claim 10, further comprising evaluating the influence of lithography process variation to the lithography image obtained by lithography.

12. A computer-implemented method for lithography simulation comprising:
- calculating a difference between a designed pattern and an obtained image from lithography technology at a specified point, wherein the specific point is generated based at least in part upon a template to a position where a library cell is placed and instantiated;
- associating template information of the specified point with a library cell and a block of the designed pattern;
- specifying a region for statistical calculation;
- performing statistical calculation for the region; and
- displaying the region and a statistical result of the calculation based at least in part upon the obtained image together on a same screen of a display device.

13. The method of claim 12, wherein an application of the template to the library cell or block is controlled by a template name.

14. A computer-implemented method for displaying a CD measurement result on display equipment, the method comprising:
- associating a template with a critical point of a shape in a library cell stored in a library database, wherein a CD marker is generated based at least in part upon the template to a position where the library cell is placed and instantiated;
- specifying a region for partial statistical calculation;
- performing partial statistical calculation for the region;
- specifying or showing a statistical result of the partial statistical calculation;
- displaying a symbol of a layout that includes one or more points for the CD measurement result, wherein the CD measurement result is based at least in part upon the CD marker; and
- displaying the region, the statistical result, and the CD measurement result together on a same screen of the display equipment, wherein the result comprises at least one result value that is associated with the symbol of the layout.

15. The method of claim 14, wherein the symbol and the at least one result value are simultaneously displayed on the display equipment.

16. The method of claim 14, wherein the CD measurement results are indicated with a value associated with at least one of color, chroma and brightness of color.

17. The method of claim 14, wherein the CD measurement results are indicated with a value associated with at least one contour line.

18. A computer-implemented method for measuring dimension of an image generated by lithography technology that uses a set of files having CD marker information, the method comprising:
- associating a template with a critical point of a shape in a library cell stored in a library database;
- specifying a measurement point by geometry;
- specifying information associated with results of lithography simulation using the CD marker information, wherein the CD marker is generated based at least in part upon the template to a position where the library cell is placed and instantiated;
- specifying information derived from manufacturing data;
- specifying a region for statistical calculation;
- performing statistical calculation for the region; and displaying the region and a statistical result of the calculation based at least in part upon the information together on a same screen of a display device.

19. A computer readable medium storing a computer program comprising instructions which, when executed by a processing system, cause the system to perform a method for lithography simulation comprising:
- associating a template with a critical point of a shape in a library cell stored in a library database;
- specifying a subject region of a lithography image with a CD marker, wherein the CD marker is generated based at least in part upon the template to a position where the library cell is placed and instantiated;
- specifying a threshold intensity over the lithography image;
- calculating an intensity of the lithography image within the subject region defined by the CD marker;
- specifying the subject region for statistical calculation;
- performing the statistical calculation for the subject region; and
- displaying the subject region and a statistical result of the calculation based at least in part upon the subject region together on a same screen of a display device.

20. The medium of claim 19, wherein a threshold value of the intensity for generating a image is specified and a sensitivity or ratio of change of an image boundary of the lithography image to lithography process variation is calculated.

21. A computer readable medium storing a computer program comprising instructions which, when executed by a processing system, cause the system to perform a method for CD measurement calculation comprising:
- associating a template with a critical point of a shape in a library cell stored in a library database;
- calculating lithography intensity on a region or line segment determined by a CD marker, wherein the CD marker is generated based at least in part upon the template to a position where the library cell is placed and instantiated;
- determining a point when lithography intensity equals a threshold;
- calculating a value of CD measurement based at least in part upon information related to the determined point;
- specifying the region or line segment for statistical calculation;
- performing the statistical calculation for the region or line segment; and
- displaying the region or line segment and a statistical result of the calculation based at least in part upon the region or line segment together on a same screen of a display device.

22. The medium of claim 21, wherein the point and the value are simultaneously displayed on the display device.

23. A computer readable medium storing a computer program comprising instructions which, when executed by a processing system, cause the system to perform a lithography process sensitivity calculation method for evaluating lithography process variation to an image obtained by lithography comprising:
- associating a template with a critical point of a shape in a library cell stored in a library database;
- specifying a region of a lithography image with a CD marker, wherein the CD marker is generated based at least in part upon the template to a position where the library cell is placed and instantiated;
- determining a first point when lithography intensity equals a threshold;
- determining a second point when lithography intensity equals the threshold plus a specified gradient value of the lithography intensity;
- calculating a distance between the first and second points;
- specifying the region for statistical calculation;
- performing the statistical calculation for the region; and
- displaying the region and a statistical result of the calculation based at least in part upon the region together on a same screen of a display device.

24. The medium of claim 23, wherein the processing system, using a processor, evaluates the influence of lithography process variation to the lithography image obtained by lithography.

* * * * *